United States Patent
Kim

(10) Patent No.: US 7,141,885 B2
(45) Date of Patent: Nov. 28, 2006

(54) WAFER LEVEL PACKAGE WITH AIR PADS AND MANUFACTURING METHOD THEREOF

(75) Inventor: Gu-Sung Kim, Seongnam (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/073,173

(22) Filed: Feb. 13, 2002

(65) Prior Publication Data

US 2003/0153171 A1 Aug. 14, 2003

(51) Int. Cl.
    *H01L 23/48* (2006.01)
(52) U.S. Cl. .................. 257/779; 257/780
(58) Field of Classification Search ............. 257/779, 257/780
    See application file for complete search history.

(56) References Cited

U.S. PATENT DOCUMENTS

| 5,592,025 | A | * | 1/1997 | Clark et al. |
| 6,165,890 | A | | 12/2000 | Kohl et al. |
| 6,221,727 | B1 | | 4/2001 | Chan et al. |
| 6,333,565 | B1 | | 12/2001 | Hashimoto |
| 6,335,222 | B1 | * | 1/2002 | DiStefano |
| 6,341,071 | B1 | * | 1/2002 | Johnson et al. |

FOREIGN PATENT DOCUMENTS

| EP | 0 529 503 A1 | 3/1993 |
| JP | 11000836 A | * | 1/1999 |
| JP | 2000133920 | * | 5/2000 |

OTHER PUBLICATIONS

Kohl, Paul A.; Martin, Kevin, "Wafer-Level Packaging Addresses Chip-to-Module Interconnections" Semiconductor International, CAHNERS Business Information, Reed Elsevier, Inc. (Apr. 2001).
Kohl, Paul A., et al, "Air-Gaps for Electrical Interconnections": Electrochemical and Solid-State Letters, 1(1):49-51, The Electrochemical Society, Inc. (1998).

* cited by examiner

*Primary Examiner*—Long Pham
(74) *Attorney, Agent, or Firm*—Lee & Morse, P.C.

(57) ABSTRACT

A structure for improving electrical performance and interconnection reliability of an integrated circuit in a Wafer Level Packaging (WLP) application comprises an air pad located under an interconnection metal solder pad. Using a low dielectric material such as air underlying the interconnection pad, pad capacitance is reduced, thereby improving the speed of associated electrical signal transitions. By configuring the structure to have interconnection pad supports at only a limited number of pad periphery points, a cured soldered connection can absorb mechanical stresses associated with divergent movement between a connecting wire and the interconnection pad. Such a structure can be manufactured using the steps of: 1) depositing a soluble base material in a cavity on an IC substrate, 2) depositing a metal pad layer on the soluble base layer, and 3) dissolving the soluble base layer, leaving an air gap under the metal pad layer which is supported by the periphery supports.

14 Claims, 6 Drawing Sheets

Heat up

Cool down

WAFER LEVEL PACKAGE WITH AIR PADS AND MANUFACTURING METHOD THEREOF

BACKGROUND OF THE INVENTION

1. Field of the Invention

The present invention generally relates to the field of semiconductor manufacturing and, more particularly, to a Wafer Level Package (WLP) with improved interconnection reliability and a method for manufacturing the same.

2. Description of the Related Art

In order to meet packaging requirements for newer generations of electronic products, efforts have been expended to create reliable, cost-effective, small, and high-performance packages. Such requirements are, for example, reductions in electrical signal propagation delays, reductions in overall component area, and broader latitude in input/output (I/O) connection pad placement.

To meet these requirements, a WLP has been developed, wherein an array of external I/O terminals is distributed over the semiconductor surface, rather than just located at one or more chip edges as in a conventional peripheral-leaded package. Typically, an array of solder balls provide the connection means between electrical signals of corresponding external connection pads and the WLP I/O terminals. Such distribution of terminal locations reduces the need for embedding signal lines that connect electrical circuit blocks of an integrated circuit (IC) to edge-located I/O terminal connection pads. Elimination of such signal lines improves the electrical performance of the device, since such lines typically have an associated high capacitance. Further, the area occupied by the IC with interconnections when mounted on a printed circuit board or other substrate is merely the size of the chip, rather than the size of a packaging leadframe. Thus, the size of the WLP may be made very small.

FIG. 1 illustrates a cross-sectional view of a conventional Ball-Grid-Array (BGA) interface structure. A chip 10 having a connecting pad 20 is attached to a substrate or printed circuit board (PCB) 50 by a solder ball 40. A significant disadvantage of such a connection means, however, is that the metallic solder balls 40 are minimally elastic. A junction between connecting pad 20 and solder ball 40 is indicated by shaded area 30. Shaded area 30 is of the same material as solder ball 40 and is shown as a distinct element for explanation purposes only in order to show the subsequent effects of cracks and non-resilient stresses that can result from divergent movements between chip 10 and PCB 50.

FIGS. 1b and 1c illustrate cross-sectional views of the conventional interface structure shown in FIG. 1a during various stages of thermal cycling, i.e., heat up and cool down, respectively, to show vertical movement and the forces that act on a solder connection as a result of the expansion and contraction;

Referring to FIG. 1b, under thermal changes that are normally associated with typical operation of an electronic device, a significant mismatch between the coefficient of thermal expansions (CTE) between the chip 10 and the epoxy-glass printed circuit board 50 can cause mechanical stress on the solder connection at junction 30. In other words, when the chip heats up during use, both the chip and the board expand at different rates, which can produce the distortion shown in FIG. 1b. When the heat is removed, both the chip and the substrate shrink at different rates as shown in FIG. 1c. The relative expansions and contractions stress the rigid interconnections, i.e., the solder balls. Such expansion/contraction differential become more pronounced for larger chip sizes, with peripheral areas of the chip exhibiting significantly larger expansion than that of a center portion of the chip.

As can be readily seen, as one or the other opposing sides of the solder connection move, such as during the aforementioned thermal expansion and contraction, a torquing can be seen on solder ball 40 and joint 30. Typically, with repeated expansion and contraction at temperatures that are below the melting point of the solder, rigid joint 30 can be stressed sufficiently to cause separation or cracking from pad 20 as indicated by the area labeled 32 in FIG. 1c, thereby damaging the reliability of the solder connection Thus, there is a demonstrated need for a WLP having improved interconnection reliability, especially between the chip and the PCB, and a method of manufacturing the same.

SUMMARY OF THE INVENTION

A feature of the present invention is to provide a semiconductor device package product, such as a Wafer Level Package (WLP), having excellent reliability and reduced production cost.

According to a preferred embodiment of the present invention, each one of a distributed plurality of electrical connection pads feature an underlying air pad, with the connective air pads preferably being manufactured using a conventional fabrication process and screen-printing technology. Construction of the air pad consists of etching an irregularly-shaped cavity in a substrate, depositing an interim support layer made from a soluble material into that cavity, depositing a metal connection pad on that interim support layer, such that at least portions of the metal connection pad extends beyond the irregularly-shaped cavity and overlays a portion of the adjacent substrate, then dissolving the support layer to create an air cushion beneath the metal connection pad, with the metal connection pad being supported by the aforementioned overlayed substrate portions.

The air pad features at least two supporting structures, at least one of which includes a metal conductor for making electrical connection to the metal connection pad. Around the periphery of the metal connection pad is sufficient space for 1) removal of the interim soluble support material needed in the deposition/formation of the metal connection pads, and 2) general freedom of thermal and vibrational movement without making contact with the substrate.

In a preferred embodiment according to the present invention, a structure for providing resilient interconnections in a wafer level package comprises a conductive pad that overlays an air space, wherein at least a portion of the air space extends laterally beyond the conductive pad, and wherein the conductive pad overlays, and is in contact with, a plurality of perimeter interconnect support structures. Further, at least one of the plurality of perimeter interconnect support structures also supports, or is integral with, a conductive metal wire that electrically connects the conductive pad to other on-chip electrical circuitry.

A preferred shape of such conductive pads is generally rectangular, with a longitudinal axis that is preferably oriented along an axis comprising a radial from a center of mass of the WLP. In an alternate embodiment of the present invention, the conductive line may be supported by at least one perimeter interconnect support structure that is positioned relative to a center of the conductive pad less than or equal to about 60 degrees of the major axis.

According to the present invention, a method for manufacturing a structure for providing resilient interconnections in a wafer level package preferably comprises the steps of: forming a cavity having a first area in a semiconductor substrate; filling the cavity with a removable material; forming a conductive layer over the removable material; patterning the conductive layer to form a conductive pad; removing the removable material to form an air space below the conductive pad; and forming an interconnection material on the conductive pad, whereby at least a portion of the air space extends laterally beyond the conductive pad. The removable material is preferably planarized before forming the conductive layer, and such planarization may use an etch-back process or a CMP process. The removable material may be selected from the group consisting of a monomeric material, a polymeric material, and an elastomeric material, such as a B-stage-able material, for example.

The cavity is formed by depositing a dielectric layer and by patterning the dielectric layer using a photolithographic process. Additionally, after forming the conductive layer, a second dielectric layer may be deposited over the conductive layer. The method preferably also includes the additional step of, after forming the air space, depositing a protective, non-corrosive metal layer on a top and a bottom surface of the conductive pad using an electroless plating method, wherein the metal is selected from the group consisting of gold and nickel.

Using a low dielectric material such as air underlying the interconnection pad, pad capacitance is reduced, thereby improving the speed of associated electrical signal transitions. By configuring the structure to have interconnection pad supports at only a limited number of pad periphery points, a finished soldered connection can absorb mechanical stresses associated with divergent movement between a connecting wire and/or solder ball and the interconnection pad.

These and other features of the present invention will be readily apparent to those of ordinary skill in the art upon review of the detailed description that follows.

BRIEF DESCRIPTION OF THE DRAWINGS

FIG. 2b illustrates a top plan view of an air pad structure after deposition of a connection pad over the air pad cavity illustrated in FIG. 2a;

DETAILED DESCRIPTION OF THE INVENTION

According to the present invention, a resilient air pad connection structure in an integrated circuit (IC) in a Wafer Level Package (WLP) provides a low dielectric capacitance separating an input/output (I/O) metal connection pad and an underlying substrate having electrical circuitry. Conventional non-resilient air pad connection structures are typically encapsulated and supported at all edges by adjacent layers. Such structures are used solely to lower the capacitance of a node by replacing an organic or silicon based dielectric material between the electrical plates of the capacitance (i.e., the connection pad and the substrate) with air, which has a lower dielectric constant. The air pad structure of the present invention, however, provides a minimum number of support points/electrical contacts at the periphery of the connection pad to allow the connection pad a maximum amount of vertical and lateral thermal and/or mechanical movement, while still providing the lower capacitance that the air medium provides. This minimum set of contacts provides resiliency in the connection joint that can reduce destructive mechanical stresses on a solder connection.

Such an air pad may be manufactured using the steps of: 1) creating in an IC substrate a cavity that has an irregular shape with a few peripheral pad supports and that is larger than a desired connection pad; 2) filling the cavity with a soluble base material; 3) after curing the soluble base material, depositing a metal pad layer on the soluble base layer and overlaying the peripheral pad supports; and 4) dissolving and removing the soluble base layer, leaving an air gap under the metal pad layer which is supported by, and in electrical contact with, the peripheral pad supports.

Figure 1A:
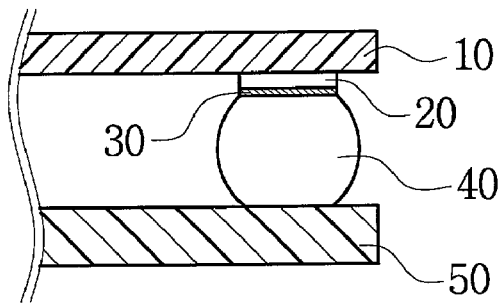
FIG. 1a illustrates a cross-sectional view of a conventional interface structure.
Figure 1B:
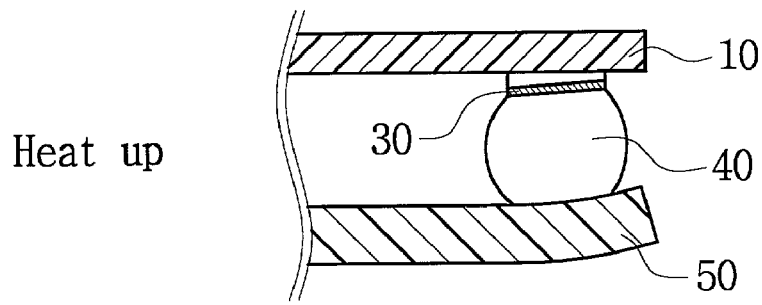
FIGS. 1b and 1c illustrate cross-sectional views of the conventional interface structure shown in FIG. 1a during various stages of thermal cycling, i.e., heat up and cool down, to show vertical movement and forces acting on a solder connection as a result of expansion and contraction.
Figure 1C:
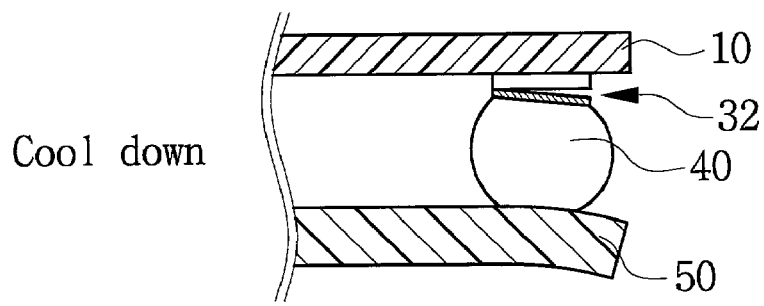
Figure 2A:
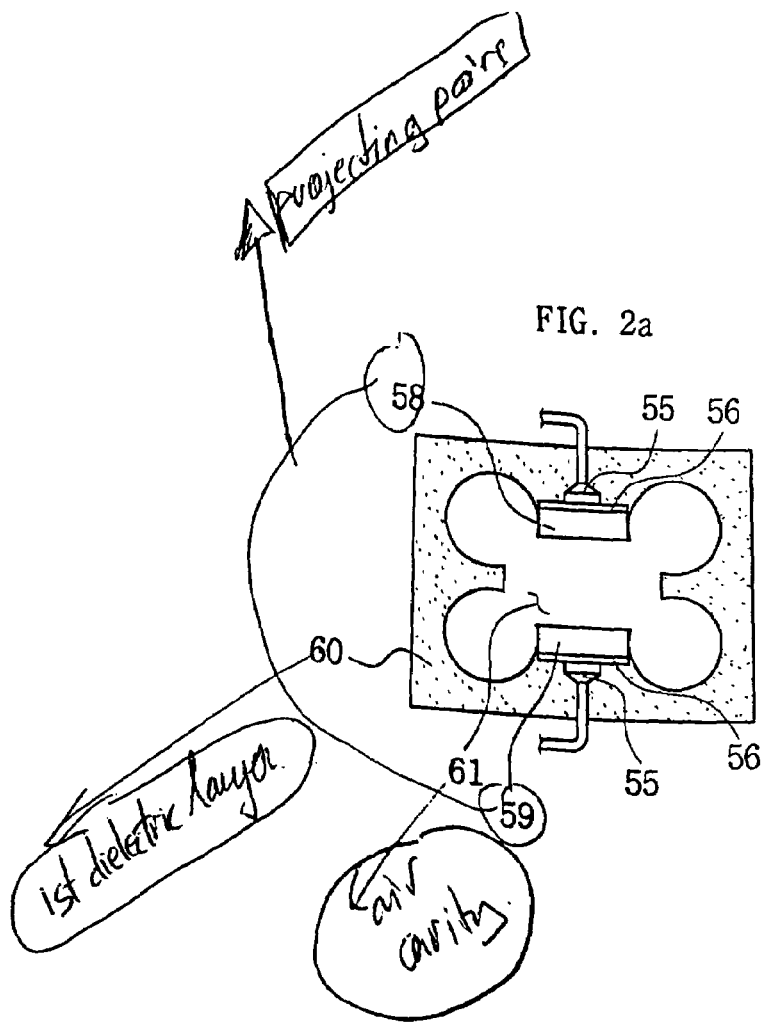
FIG. 2a illustrates a top plan view of an air pad cavity according to a preferred embodiment of the present invention.
Figure 2B:
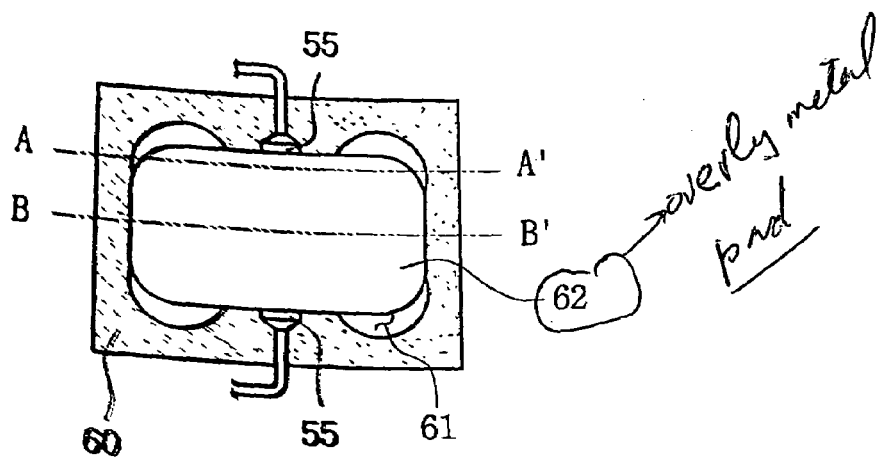

FIGS. 2a and 2b illustrate a top view of an air pad cavity 61 before and after the deposition of an overlying metal connection pad 62.

FIG. 2a shows a top view of an air pad cavity 61 according to a preferred embodiment of the present invention. The depth of cavity 61 is sufficient such that under all environmental and mechanical conditions, a flexing of the subsequent overlaying metal pad 62 will not contact the bottom of cavity 61. The shape of cavity 61 is such that projecting pairs 58 and 59 in FIG. 2a preferably provide supports for a metal connection pad 62 to be deposited in a following step. It should be noted that a minimum of two such opposing supports 58 or 59 are required, although most applications would preferably have three or four such supports 58 and 59. For an application where maximum vertical movement flexibility is required during soldering, only two supports would be employed, thereby allowing the metal connection pad 62 the ability to "rock" during soldering of an external connecting means, i.e., the solder ball. Alternate embodiments may employ wires as the external connecting means for additional connection resiliency and reliability, while still employing the size and space advantages of the WLP technology.

FIG. 2b illustrates an air pad structure after deposition or placement of metal connection pad 62 over the air pad cavity illustrated in FIG. 2a. As can be seen from the top plan views of FIGS. 2a and 2b, cavity 61 is preferably larger than metal connection pad 62, except at support/connection point pairs 58 and 59, such that portions of metal connection pad 62 that are not in contact with support/connection points 58 and 59 are suspended in space and have limited freedom of vertical movement into the air gap below. The over-sizing of cavity 61 also provides an exposed area between the edges of cavity 61 and the edges of metal connection pad 62, wherein the dissolving agent can be applied and the interim soluble base material can be removed. For metal connection pads 62 that provide electrical signal connections, one or more of the support/connection points 58 and 59 includes an embedded electrical wiring land pattern 55, which makes direct electrical connection with metal connection pad 62. The total contact area of the metal connection between the wiring land patterns 55 and the metal connection pad 62 must equal the current carrying cross-section of wiring land pattern 55. This is shown as the widening of the wiring land patterns 55 at point 56.

Figure 3A:
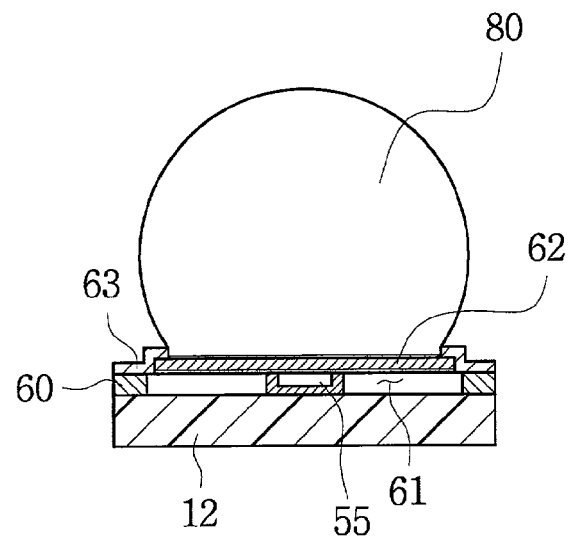
FIG. 3a illustrates a cross-sectional view taken along line I–I' of FIG. 2b.
Figure 3B:
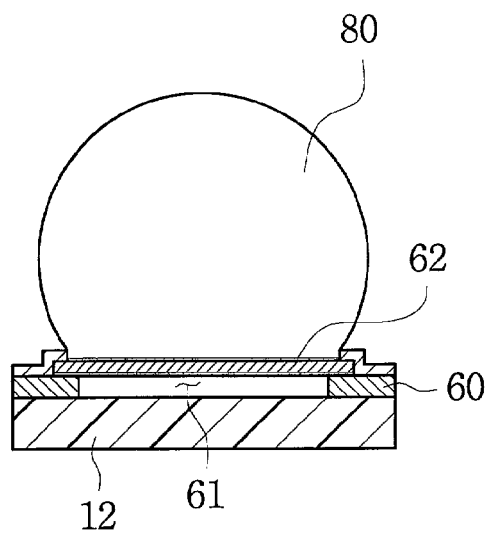
FIG. 3b illustrates a cross-sectional view taken along line II–II' of FIG. 2b.

FIG. 3a illustrates a cross-section view taken along the line I–I' of FIG. 2b, and FIG. 3b illustrates a cross-sectional view taken along the line II–II' of FIG. 2b. Referring to FIGS. 3a and 3b together, in order to protect integrated circuits on the wafer from the difference of CTE between a passivation layer 12 such as SiN, SiON, etc. and a metal that is used in wiring and connection patterns, such as silver (Ag), copper (Cu), and from the mechanical damage, a first dielectric layer 60 is interposed therebetween. This first dielectric layer 60 serves as a stress buffer and improves the electrical signal response properties. The first dielectric layer 60 is preferably comprised of a polyimide material (dielectric constant: 2.8) with a thickness of about 2 microns to about 50 microns.

On first dielectric layer 60 are formed wiring land patterns 55 preferably consisting of a metal, such as silver (Ag) or copper (Cu). Such wiring patterns 55 having a predetermined thickness and width may be formed using conventional sputtering, evaporation, electroplating, electroless-plating methods, or combination of these methods. The thickness of the wiring is preferably thicker than that of the metal layer of a conventional fabrication process, i.e., approximately 15 µm to approximately 50 µm.

Overlaying the wiring land patterns, a second dielectric layer 63 is preferably formed of a polyimide material with a thickness of about 2 µm to about 50 µm. Second dielectric layer 63 provides lateral mechanical protection for a solder ball 80, thereby protecting solder ball 80 from joint failure and reducing potential mechanical damage to the chip rather than improving the electrical properties. Material of the second dielectric layer is preferably selected for superior mechanical and chemical properties that protect the chip from the external environment stresses.

In aligned cavities in second dielectric layer 63, connection pad regions are formed and exposed using a lithographic process. The exposed pad regions are electroplated or electroless-plated with a metal such as nickel (Ni), copper (Cu), gold (Au), thereby forming metal connection pads 62. Solder balls 80 are placed on the metal connection pads 62.

FIGS. 4a to 4k illustrate cross-sectional views at steps of an exemplary process for manufacturing an air pad structure in accordance with the present invention. The view perspective is from the line B–B' as shown in FIG. 2b. Although this view does not show the openings between the cavity and the metal connection pad 62 through which the interim support layer is removed, such openings are integral to the invention.

Figure 4A:
FIGS. 4a to 4k illustrate cross-sectional views at representative steps of a process for manufacturing an air pad structure according to a preferred embodiment of the present invention.
Figure 4B:
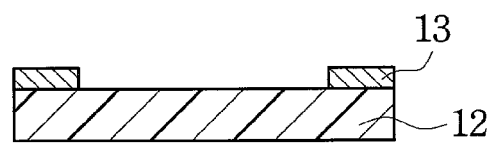

FIG. 4a illustrates a wafer 12 that is fabricated using conventional integrated circuit manufacturing techniques. In FIG. 4b, a first dielectric layer 13 is formed by coating polyimide material on wafer 12, which is then soft-cured, exposed and developed. After etching to form the connection pad cavity 61 and support pad 58 and 59 (not shown), first dielectric layer 13 is hard-cured.

Figure 4C:
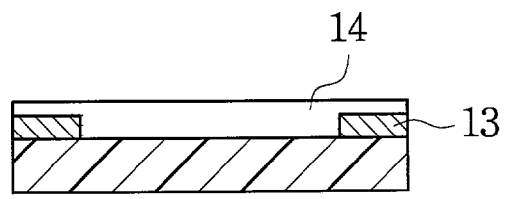
Figure 4D:
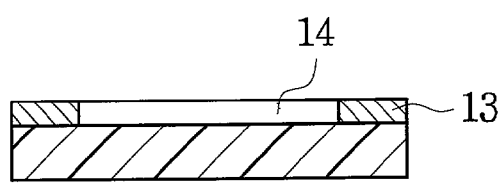
Figure 4E:
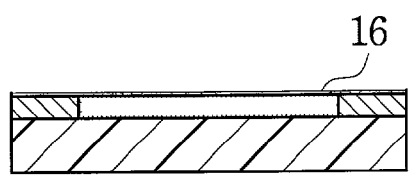

As shown in FIG. 4c, a B-stage-able polymer 14 is formed preferably by a spin-coating method. Then, as shown in FIG. 4d, the B-stage-able polymer is planarized using an etch-back method or a Chemical Mechanical Polishing (CMP) method to provide a uniform surface. A seed metal 16 is then sputtered by an electroplating process to produce the stage illustrated in FIG. 4e. After printing a photoresist 17 on the seed metal 16, the photoresist 17 is patterned as shown in FIG. 4f.

Figure 4F:
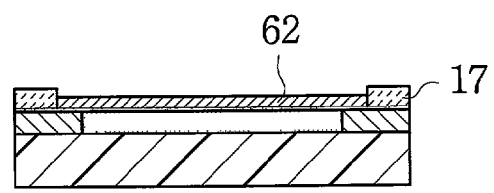
Figure 4G:
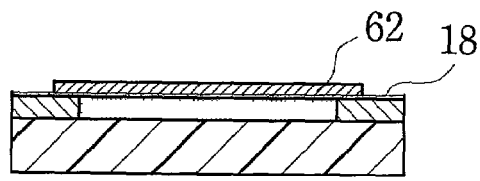
Figure 4H:
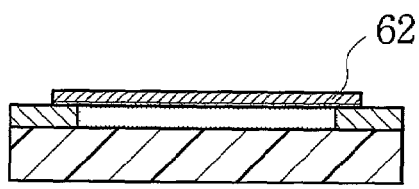

As shown in FIG. 4f, metal is plated on the exposed portions on the seed metal 16 and a photoresist 17 is removed, thereby forming metal connection pads 62 as shown in FIG. 4g. As shown in FIG. 4h, an outer seed metal 18 outside the perimeter of the connection pads is removed by etching to yield only the connection pad 62 above the planar surface as shown in FIG. 4h.

Figure 4I:
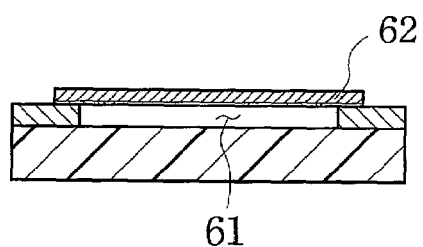
Figure 4J:
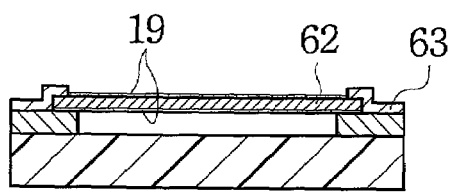
Figure 4K:
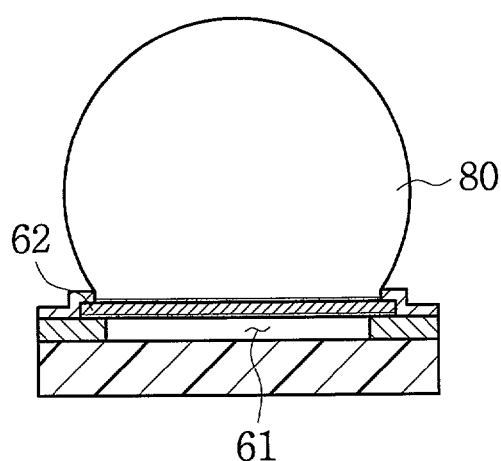

Referring to FIG. 4i, the B-stage-able polymer 14 is removed through the aforementioned spatial openings (not shown) between the metal connection pad 62 and the cavity edge by preferably being dissolved with wet etching chemical agent, thereby forming an air pad cavity 61. (See also FIGS. 5a and 5b.) Then, as shown in FIG. 4j, in order to laterally support the metal connection pads 62, a second dielectric layer 63 is formed. Both surfaces of the metal of the connection pads are then plated with an anti-corrosion protective metal, such as nickel (Ni) or gold (Au) 19, preferably using an electroless-plating method. Finally, as shown in FIG. 4k, a solder ball 80 is formed or placed and retained with an adhesive means on metal connection pad 62.

Although the present invention preferably uses B-stage-able polymer as the decomposed material under the connection pad, other material such as polysiloxane, etc. may be substituted for the B-stage-able polymer.

The present invention provides a WLP with an air pad structure, on which patterned (open) air gaps are formed under solder ball connection pads 62, thereby improving the reliability and the electrical properties of the WLPs.

Figure 5A:
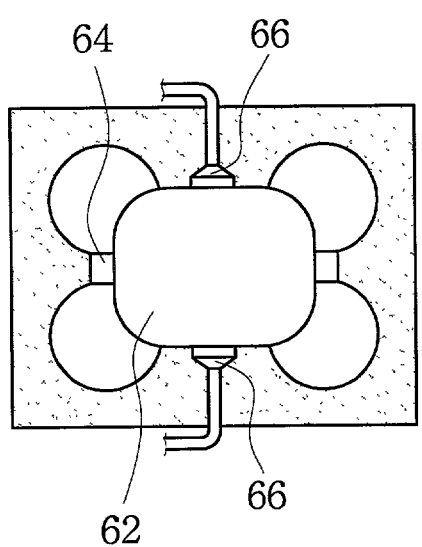
FIG. 5a illustrates a top plan view of a second embodiment of an air pad structure according to the present invention.
Figure 5B:
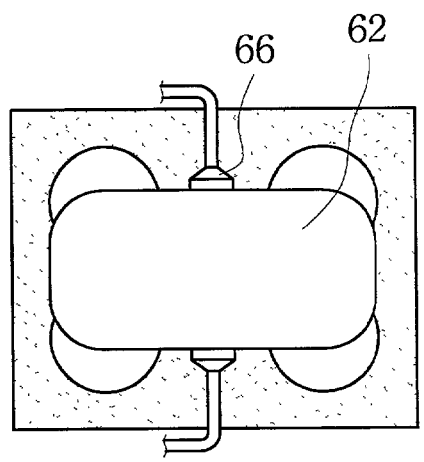
FIG. 5b illustrates a top plan view of a third embodiment of an air pad structure according to the present invention.

FIG. 5a shows a second embodiment of an air pad according to the present invention. In this embodiment, a generally square connection pad 62 that has two metal supports 64 and two dielectric supports 66, rather than the four dielectric supports, such as support pairs 58 and 59 in FIGS. 2a and 2b. FIG. 5b illustrates a third embodiment according to the present invention, wherein a metal connection pad 62 has a more rectangular shape than the oblong connection pad 62 shown in FIG. 2b. Connection pad 62 in this embodiments may supported by two or four metal supports (not shown) or two or four dielectric supports 66 or combination thereof similar to those shown in FIG. 5a.

A preferred embodiment of the present invention has been disclosed herein and, although specific terms are employed, they are used in a generic and descriptive sense only and not for purpose of limitation. It will therefore be understood by those of ordinary skill in the art that various changes in form and details may be made without departing from the spirit and scope of the invention as set forth in the following claims.

What is claimed is:

1. A structure for providing resilient interconnections in a wafer level package, comprising a conductive pad that directly overlays an air space formed in a dielectric layer, wherein at least a portion of the air space formed in the dielectric layer extends laterally beyond the conductive pad and wherein a perimeter of the conductive pad directly overlies both regions of the air space formed in the dielectric layer and regions of the dielectric layer.

2. The structure as claimed in claim 1, wherein the air space comprises a geometric structure having a plurality of perimeter interconnect support structures for the conductive pad.

3. The structure as claimed in claim 2, wherein at least one perimeter interconnect support structure also supports a conductive line electrically connected to the conductive pad.

4. The structure as claimed in claim 3, wherein the conductive line is a metal wire.

5. The structure as claimed in claim 1, wherein a major axis of the air space is radial to a center of the wafer level package.

6. The structure as claimed in claim 1, wherein a major axis of the air space is not radial to a center of the wafer level package.

7. The structure as claimed in claim 1, wherein the conductive pad comprises a bond pad.

8. The structure as claimed in claim 1, wherein the air space formed in the dielectric layer comprises a plurality of perimeter support structures that partially underlie the conductive pad.

9. The structure as claimed in claim 8, wherein the air space formed in the dielectric layer comprises a plurality of perimeter dielectric support structures that partially underlie the conductive pad.

10. A structure for providing resilient interconnections in a wafer level package, comprising a conductive pad that directly overlays an air space, wherein at least a portion of the air space extends laterally beyond the conductive pad and wherein the air space comprises a geometric structure having a plurality of perimeter interconnect support structures for the conductive pad.

11. The structure as claimed in claim 10, wherein at least one perimeter interconnect support structure also supports a conductive line electrically connected to the conductive pad.

12. The structure as claimed in claim 11, wherein the conductive line is a metal wire.

13. The structure as claimed in claim 10, wherein a major axis of the air space is radial to a center of the wafer level package.

14. The structure as claimed in claim 10, wherein a major axis of the air space is not radial to a center of the wafer level package.

* * * * *